United States Patent
Kong et al.

(10) Patent No.: US 11,780,210 B2
(45) Date of Patent: Oct. 10, 2023

(54) GLASS DIELECTRIC LAYER WITH PATTERNING

(71) Applicant: Intel Corporation, Santa Clara, CA (US)

(72) Inventors: Jieying Kong, Chandler, AZ (US); Gang Duan, Chandler, AZ (US); Srinivas Pietambaram, Chandler, AZ (US); Patrick Quach, Chandler, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 16/574,252

(22) Filed: Sep. 18, 2019

(65) Prior Publication Data

US 2021/0078296 A1 Mar. 18, 2021

(51) Int. Cl.
*H01L 21/00* (2006.01)
*B32B 17/10* (2006.01)
*B32B 15/20* (2006.01)
*H01L 23/00* (2006.01)
*H01L 23/48* (2006.01)

(52) U.S. Cl.
CPC ........ *B32B 17/10192* (2013.01); *B32B 15/20* (2013.01); *H01L 23/481* (2013.01); *H01L 24/09* (2013.01); *H01L 2224/02379* (2013.01)

(58) Field of Classification Search
CPC .. B32B 17/10192; B32B 15/20; H01L 23/481
See application file for complete search history.

(56) References Cited

U.S. PATENT DOCUMENTS

| | | | | |
|---|---|---|---|---|
| 11,164,818 B2* | 11/2021 | Pietambaram | .... | H01L 23/49894 |
| 11,355,438 B2* | 6/2022 | Pietambaram | .......... | H01L 24/97 |
| 11,508,575 B2* | 11/2022 | Kim | ....................... | B32B 17/06 |

(Continued)

FOREIGN PATENT DOCUMENTS

| CN | 113314474 A | * | 8/2021 | | |
| DE | 102019120381 A1 | * | 1/2021 | ......... | H01L 21/4857 |

(Continued)

OTHER PUBLICATIONS

International Search Report and Written Opinion for International Patent Application No. PCT/US2020/036980, dated Sep. 23, 2020, 11 pages.

(Continued)

*Primary Examiner* — Laura M Menz
(74) *Attorney, Agent, or Firm* — Schwabe, Williamson & Wyatt, P.C.

(57) ABSTRACT

Embodiments of the present disclosure may generally relate to systems, apparatus, and/or processes directed to a manufacturing process flow for packages that include one or more glass layers that include patterning features, such as electrically conductive traces, RDLs, and vias within the packages. In embodiments, a package may include a glass layer with a first side and a second side opposite the first side, where the glass layer is a dielectric layer. The package may include another layer coupled with the first side of the glass layer, and a pattern on the second side of the glass layer to receive a deposited material in at least a portion of the pattern.

9 Claims, 9 Drawing Sheets

(56) References Cited

U.S. PATENT DOCUMENTS

| | | | |
|---|---|---|---|
| 11,531,174 B2* | 12/2022 | Kim | G02B 6/4212 |
| 2003/0137056 A1* | 7/2003 | Taniguchi | H05K 1/115 |
| | | | 257/E23.009 |
| 2007/0155174 A1* | 7/2007 | Taniguchi | H01L 23/49827 |
| | | | 257/E23.009 |
| 2011/0304999 A1 | 12/2011 | Yu et al. | |
| 2015/0313020 A1* | 10/2015 | Takahashi | H05K 3/007 |
| | | | 216/18 |
| 2016/0111380 A1* | 4/2016 | Sundaram | H01L 23/49822 |
| | | | 438/126 |
| 2016/0315024 A1 | 10/2016 | Lai et al. | |
| 2020/0006232 A1* | 1/2020 | Pietambaram | H01L 24/97 |
| 2020/0312767 A1* | 10/2020 | Pietambaram | H01L 23/15 |
| 2021/0028080 A1* | 1/2021 | Pietambaram | H01L 25/0652 |
| 2021/0078296 A1* | 3/2021 | Kong | B32B 17/10 |
| 2022/0028788 A1* | 1/2022 | Pietambaram | H01L 23/49822 |
| 2022/0254721 A1* | 8/2022 | Pietambaram | H01L 25/0655 |
| 2022/0310518 A1* | 9/2022 | Chen | H01L 21/4857 |
| 2022/0375865 A1* | 11/2022 | Pietambaram | H01L 23/5386 |
| 2022/0406725 A1* | 12/2022 | Kamgaing | H01L 23/15 |

FOREIGN PATENT DOCUMENTS

| | | | | |
|---|---|---|---|---|
| EP | 4105983 A1 * | 12/2022 | | H01L 21/4853 |
| KR | 10-2012-0074695 | 7/2012 | | |
| TW | 201419394 A * | 5/2014 | | B32B 17/06 |
| WO | WO 2014-038326 | 3/2014 | | |
| WO | WO 2014038326 | 3/2014 | | |
| WO | WO-2014038326 A1 * | 3/2014 | | H01L 21/486 |
| WO | WO-2018094162 A1 * | 5/2018 | | C03C 4/14 |

OTHER PUBLICATIONS

Office Action from Indian Patent Application No. 202247008562, dated Feb. 13, 2023, 6 pgs.

\* cited by examiner

GLASS DIELECTRIC LAYER WITH PATTERNING

FIELD

Embodiments of the present disclosure generally relate to the field of package assemblies, and in particular package assemblies that include dielectric layers.

BACKGROUND

Continued reduction in end product size of mobile electronic devices such as smart phones and ultrabooks is a driving force for the development of reduced size system in package components.

DETAILED DESCRIPTION

Figure 1A:
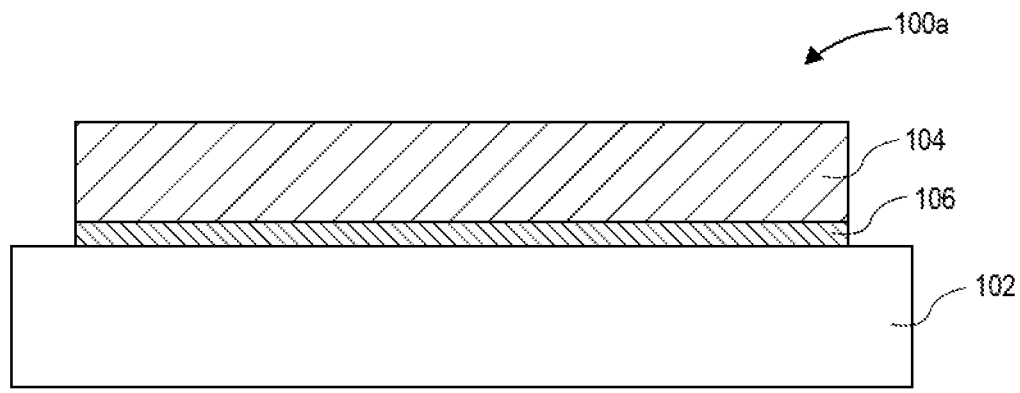
FIGS. 1A-1E illustrate an example of a package assembly using a glass dielectric layer with patterning at various stages of a manufacturing process, in accordance with embodiments.

Embodiments of the present disclosure may generally relate to systems, apparatus, and/or processes directed to a manufacturing process flow for packages that include one or more glass layers that include patterning features, such as electrically conductive traces, RDLs, and vias within the packages. In embodiments, a package may include a glass layer with a first side and a second side opposite the first side, where the glass layer is a dielectric layer. The package may include another layer coupled with the first side of the glass layer, and a pattern on the second side of the glass layer to receive a deposited material in at least a portion of the pattern.

Requirements for higher speed and bandwidth for portable and high-performance applications have been driving flip chip interconnection bump pitch (BP) scaling down to sub 30 µm level. As a consequence, the thermal-compression bonding (TCB) process requires a tighter solder bump height variation target and substrate thickness variation target within the die area. The substrate thickness variation target at the die area may be 2 µm or less.

In addition, increased substrate functionality such as enabling die to die connection through Embedded Multi-die Interconnect Bridge (EMIB®) architecture may result in more challenges on meeting the substrate thickness variation target. Compared to traditional monolithic organic substrate process, encapsulating dielectric material on silicon bridge dies is known to have increased risk of flatness control—as a result, adding more challenge to substrate thickness variation control.

Glass is known to have flatness benefit and its thickness variation can be below 2 micron within the die area. Traditionally glass may be used as a patch to connect base substrate and dies, for example using a through glass via (TGV) or TGV with embedded bridge dies. However, TGVs or TGVs with embedded bridge dies may be limited in legacy implementations with layer counts and design rules due to their incapability of fabricating multiple RDLs. Or glass may be used as a temporary carrier to allow low thickness variation build up layers laminated and patterned above. However, the benefit of low thickness variation may be reduced after glass carrier is released.

To maximize glass benefit in substrate and packaging application, one or more permanent glass layers with RDL capability may be implemented in organic non EMIB or EMIB architectures. Embodiments are not limited to two architectures described above. Embodiments may include any substrate and packaging application requiring thickness variation control.

Embodiments described herein may be directed to apparatus, systems, and processes to create patterns, for example traces and vias at designated glass layers within a package, in order to use the patterns as RDL layers and through-glass vias to provide patterning and fan-out capability. These embodiments enable components of a package to maintain flatness benefit of glass. In addition, substrates and packages that include glass with RDL capability as a part of its structure provide architecture design advantages. These advantages may be achieved by allowing flexible design rules to address substrate and assembly process yield issues.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIGS. 1A-1E illustrate an example of a package assembly using a glass dielectric layer with patterning at various stages of a manufacturing process, in accordance with embodiments. FIG. 1A shows the package 100a at a substrate stage where a glass layer 104 is coupled to a base substrate 102. In embodiments, the glass layer 104 may be laminated with a dielectric adhesive 106, which may be used to adhere or laminate the glass layer 104 to the base substrate 102. In embodiments, the glass layer 104 may be 40 µm in thickness. In embodiments, a thickness of the glass layer 104 may be 35 µm. The adhesive 106 may include an Ajinomoto Build-up Film (ABF) or similar film. In embodiments, the adhesive 106 may adhere permanently after curing. In embodiments, the adhesive 106 may be a dielectric adhesive. In embodiments, the thickness of the adhesive may be 5 µm. The base substrate 102 may a substrate, a partially finished substrate, a package core, or some other package component. In embodiments, the substrate 102 may be a carrier substrate that is later stripped away.

Figure 1B:
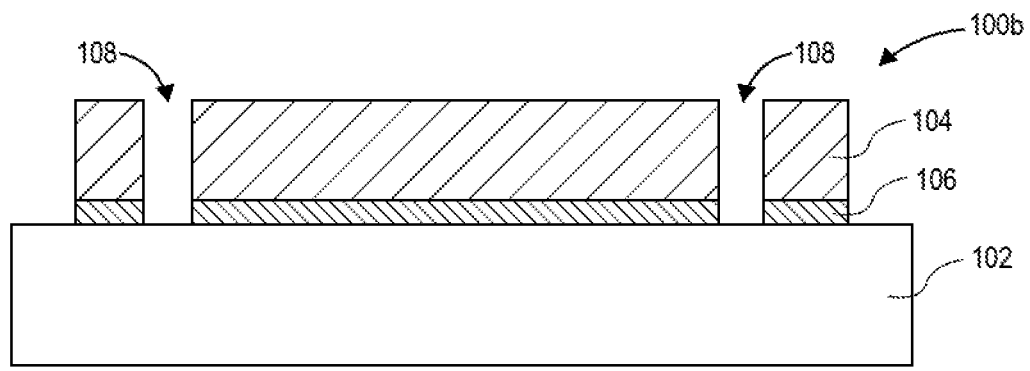

FIG. 1B shows the package 100b at a substrate stage where the glass layer 104 may be patterned with through-holes 108. In embodiments, this patterning may be performed using laser etching, dry etching, wet etching, or some combination thereof. In embodiments, the through-holes 108 may extend through the dielectric adhesive 106 to and/or into the base substrate 102. In embodiments, if a laser etching or dry etching technique is used, the adhesive 106 may also be drilled or etched through. In embodiments, if a wet etching technique is used, depending on chemical resistance of the dielectric, additional laser drilling may be used to further open the through-holes 108 to the substrate 102. A desmear technique may subsequently be used to remove debris and to clean the through-hole 108.

Figure 1C:
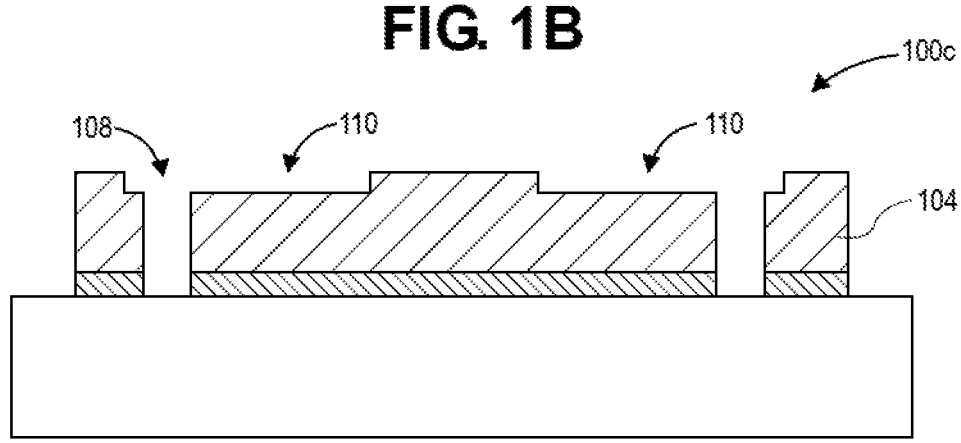

FIG. 1C shows the package 100c at a substrate stage where glass surface patterning 110 is applied to the glass layer 104. In embodiments, the glass surface patterning 110 may also be referred to as a surface trench pattern formation. A laser etching, dry etching or chemical etching process may be used in conjunction with lithography patterning. In embodiments, surface trench patterning may etch up to 15 µm deep within the glass 104 surface to receive embedded copper traces as described further below. In embodiments, the glass surface patterning 110 may couple or overlap with through through-holes 108. In embodiments, the glass surface patterning 110 may be in various depths within the glass layer 104, and may be in a layout pattern that matches surface routing traces and/or RDL patterns. Note: a top-down example embodiment view is shown in diagram 200 of FIG. 2.

Figure 1D:
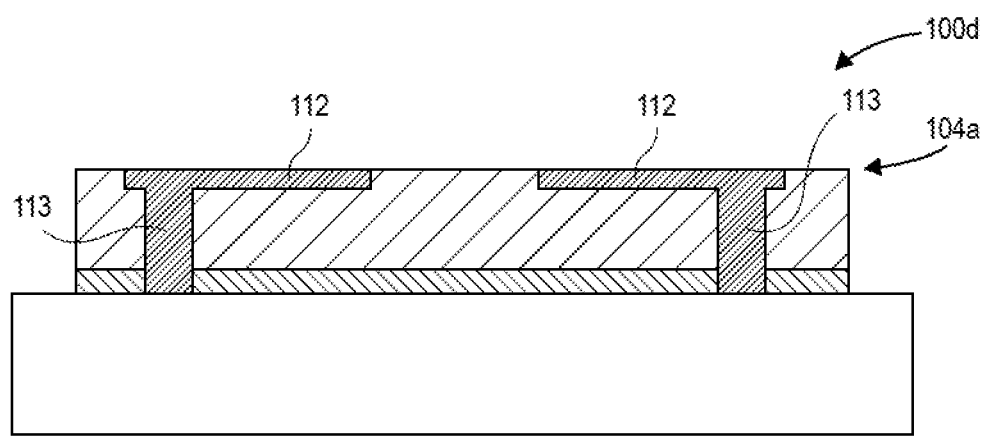

FIG. 1D shows the package 100d at a substrate stage where the patterning, including glass through-holes 108, are at least partially filled with material to create a via 113, and the surface patterning 110 is at least partially filled with material to create an RDL 112. In embodiments, the material may be an electrically conductive material such as copper, a copper alloy, or aluminum alloy. In embodiments, the material may be placed using a sputtered titanium/copper seeding process by using a seed layer deposition. After the seed layer is formed, an elytic plating process may be used, and a lithography patterning process may be used to fill the through-holes 108 and surface patterning 110. In embodiments, a plating process may be used. In embodiments, the through-holes 108 may include solid material to create a solid via 113, or in embodiments the material may be deposited around the edges of the through holes 108 using a sputtering process to create a hollow via 113 that is still electrically conductive. In embodiments, the top of the glass layer 104a may be planarized subsequent to the material fill described above to obtain a flat surface. This planarization is important because a subsequent glass sheet may not be compatible with topological morphology.

Figure 1E:
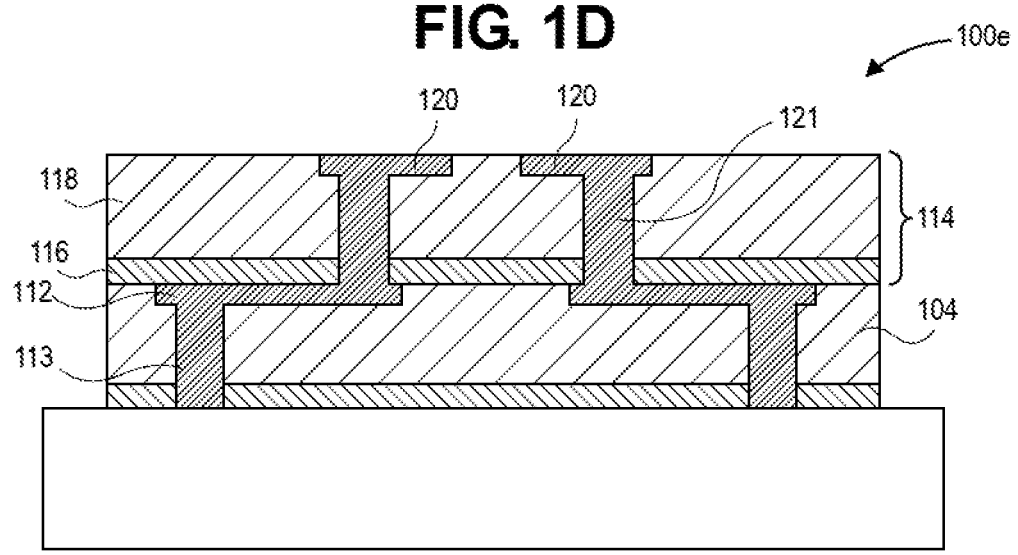

FIG. 1E shows the package 100e at a substrate stage where a second layer 114 is placed on the glass layer 104. In embodiments, the second layer 114 may include a second glass layer 118 that is coupled with the glass layer 104 using an adhesive 116. In embodiments, the second glass layer 118 may include patterning that is used to create vias 121 and RDL 120 using the techniques as described above. In addition, the vias 121 and RDL 120 may use patterns that cause them, when filled with material, to be electrically coupled with the RDL 112 and vias 113 in glass layer 104. In this way, multiple RDL layers 112, 120 may be formed within the package.

Figure 2:
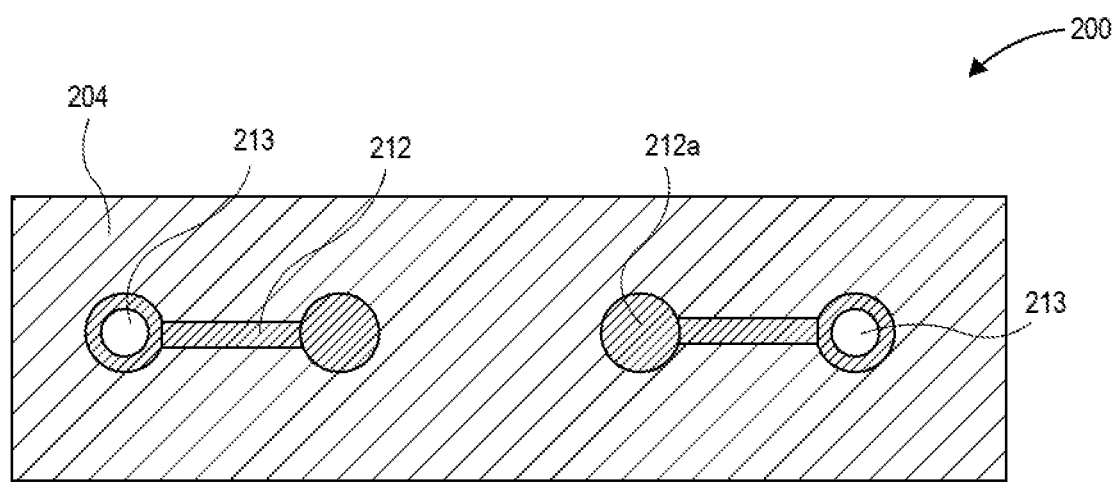
FIG. 2 illustrates an example of a top-down view of a glass layer of a package that includes patterning, in accordance with embodiments.

FIG. 2 illustrates an example of a top-down view of a glass layer of a package that includes patterning, in accordance with embodiments. Diagram 200 shows a top-down view of glass layer 204, which may be similar to glass layer 104 of FIG. 1A. Through-glass vias 213, which may be similar to vias 113 of FIG. 1D, and traces 212, that may be similar to traces 112 of FIG. 1D, are created in the glass layer 204 as shown. In embodiments, the traces 212 may include pads 212a that may be used for connections to adjacent layers of the package.

Figure 3:
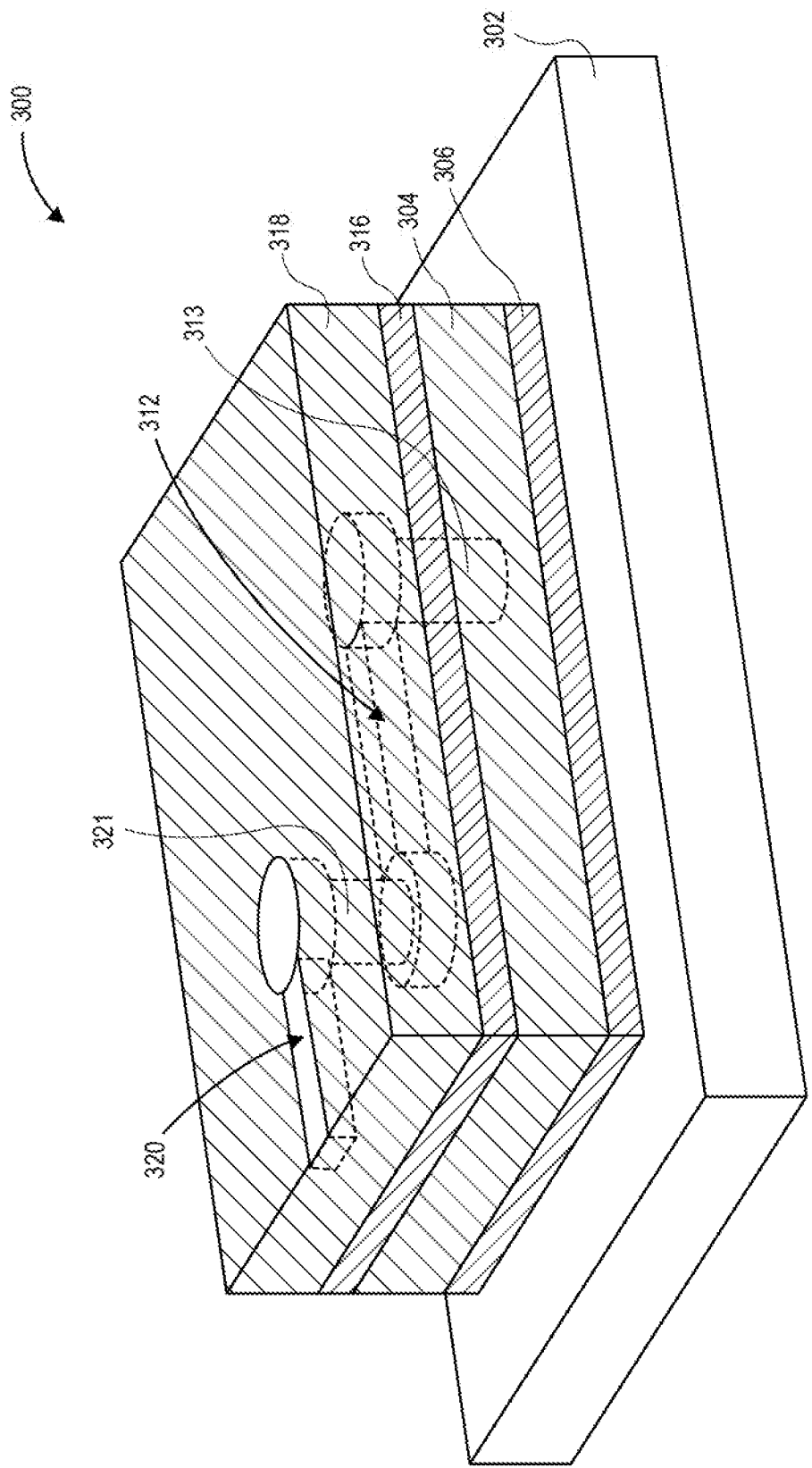
FIG. 3 illustrates an example three-dimensional view of a package with two glass dielectric layers with patterning, in accordance with embodiments.

FIG. 3 illustrates an example three-dimensional view of a package with two glass dielectric layers with patterning, in accordance with embodiments. Diagram 300 shows a three-dimensional view of two RDL layers that use glass as a dielectric. Substrate 302, which may be similar to substrate 102 of FIG. 1A, may be coupled using an adhesive 306 to a first glass layer 304, which may be similar to adhesive 106 and glass layer 104 of FIG. 1A. Within the first glass layer 304, there may be a via 313, and RDL 312, which may be similar to via 113 and traces 112 (RDL) of FIG. 1D.

A second glass layer 318 and an adhesive 316, which may be similar to second glass layer 118 and adhesive 116 of FIG. 1E, may be coupled with the first glass layer 304. The RDL 312 of the first glass layer 304 may be electrically coupled with a via 321 and an RDL 320 within the second glass layer 318, which may be similar to via 121 and RDL 120 of FIG. 1E. In embodiments, the package 300 may be manufactured using one or more techniques as described above.

Figure 4:
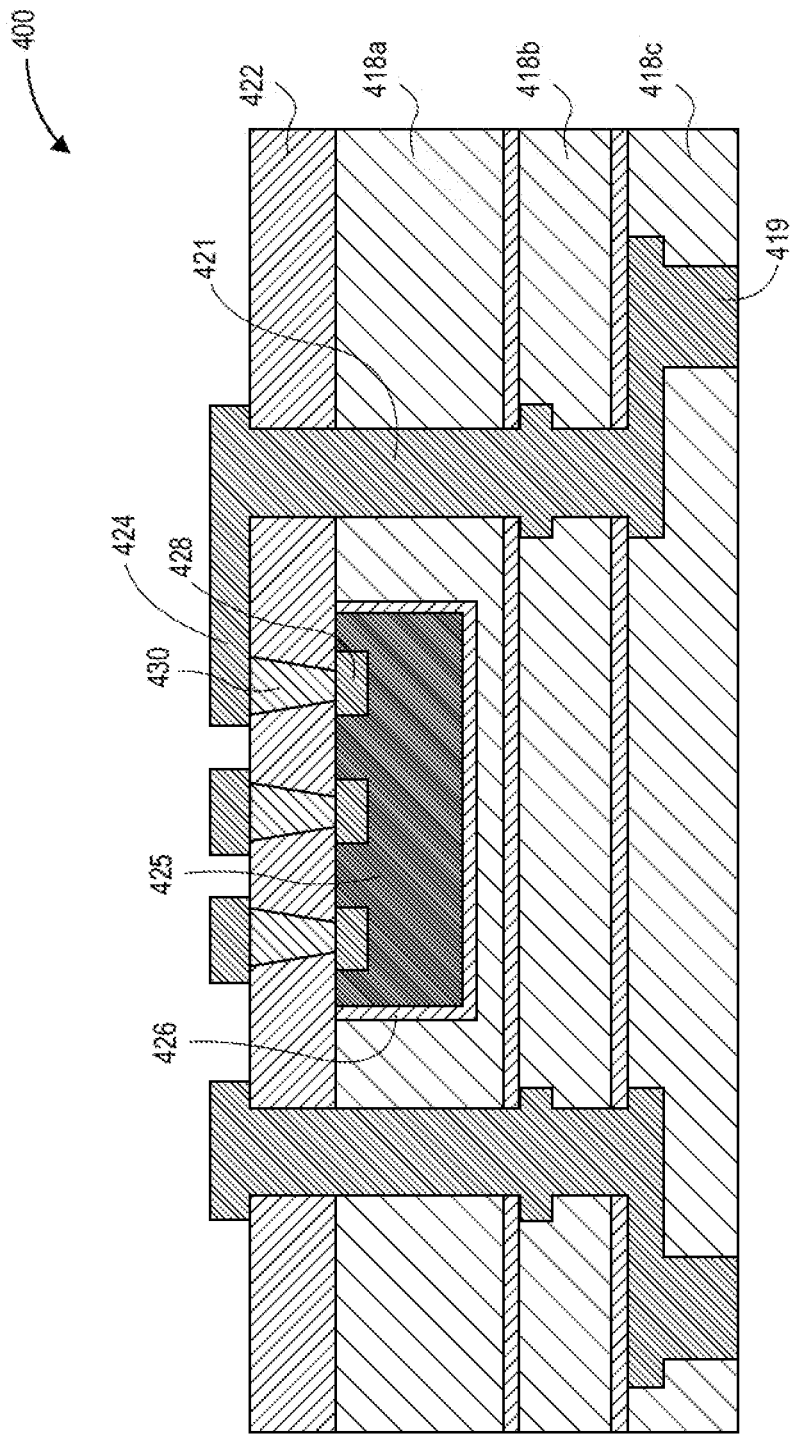
FIG. 4 illustrates an example of a package having an embedded silicon bridge die in glass with a redistribution layer (RDL) at a mid-level interconnect (MLI) side, in accordance with embodiments.

FIG. 4 illustrates an example of a package having an embedded silicon bridge die in glass with a RDL at a MLI side, in accordance with embodiments. Diagram 400 shows an example of a multi-layer glass RDL implementation incorporated with an EMIB architecture. An EMIB die 425 is coupled to an organic dielectric layer 422 and is electrically coupled from pad 428 through via 430 to an RDL 424 on top of an organic dielectric layer 422. In embodiments, the EMIB die 425 may be at least partially surrounded by a dielectric layer 426 or by some other material. The RDL 424 is further electrically coupled using a series of vias 421, which may be similar to vias 321, 313 of FIG. 3, that extend through multiple glass layers 418a, 418b, 418c through to a bottom side of the package 419. This may correspond to the MLI side of the package. In embodiments, the pad 428, via 430, RDL 424, and vias 421 may include copper or a copper alloy. In embodiments, glass layers 418b, 418c below the EMIB die 425 provide insulation and rigidity support.

Figure 5:
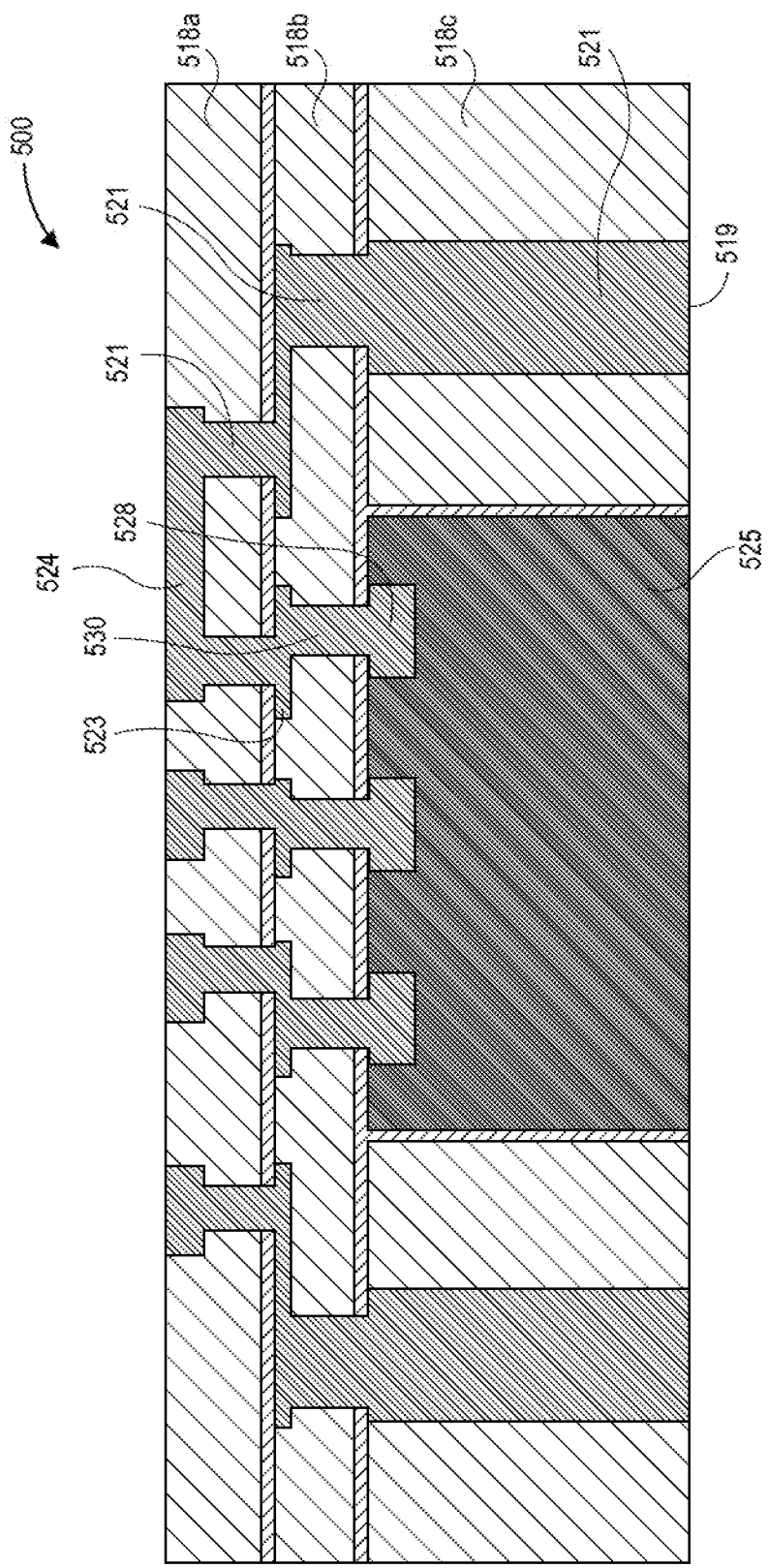
FIG. 5 illustrates an example of a package having an embedded silicon bridge die in glass with a RDL at a first level interconnect (FLI) side, in accordance with embodiments.

FIG. 5 illustrates an example of a package having an embedded silicon bridge die in glass with a RDL at a FLI side, in accordance with embodiments. Diagram 500 shows another example of a multi-layer glass RDL implementation incorporated with an EMIB architecture. EMIB die 525 may be electrically coupled from pad 528 through a series of vias 530 and intermediate RDLs 523 to the FLI RDL 524, which may be similar to RDL 424 of FIG. 4. The FLI RDL 524 may then be electrically coupled to the bottom of the package 519 through vias 521 through various glass layers 518a, 518b, 518c. In embodiments, the pad 528, via 530, intermediate RDLs 523, FLI RDL 524, and vias 521 may include copper or a copper alloy. In embodiments, a glass RDL technique may also be applied in a through-glass via patch both with and without die embedding, that may be similar to diagram 400 of FIG. 4 and diagram 500 of FIG. 5.

Figure 6:
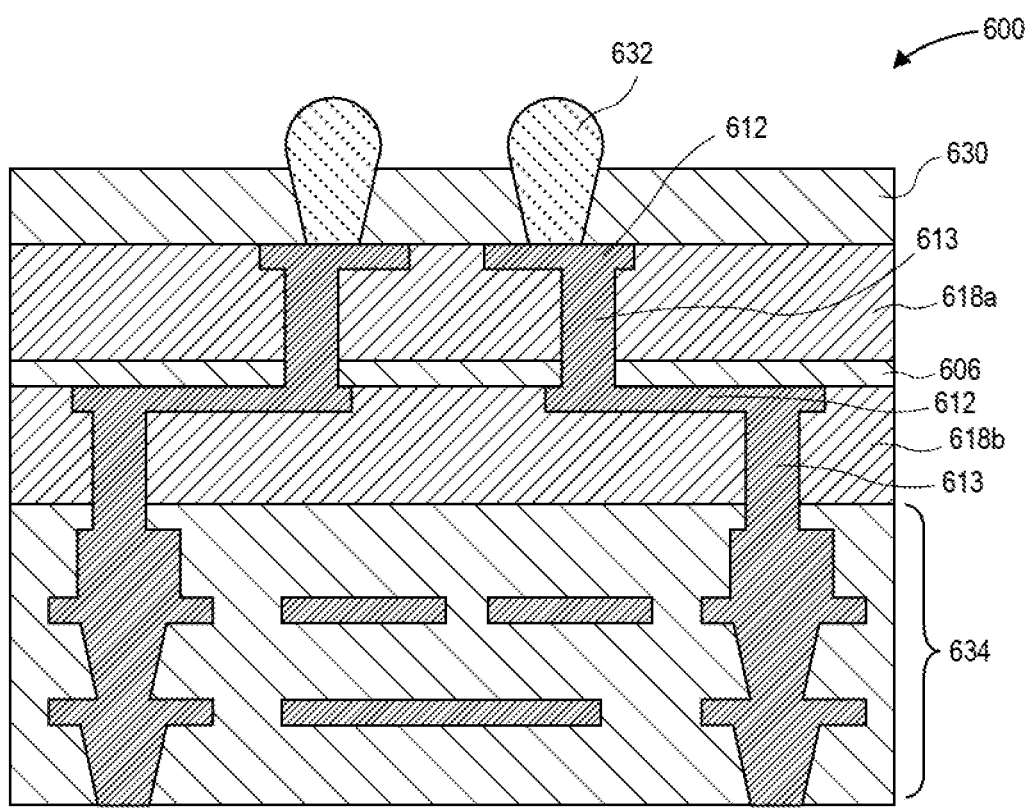
FIG. 6 illustrates an example of a package having a RDL on a glass layer implemented as an organic substrate hybrid architecture, in accordance with embodiments.

FIG. 6 illustrates an example of a package having a RDL on a glass layer implemented as an organic substrate hybrid architecture, in accordance with embodiments. Diagram 600 shows how a glass RDL technique may be applied selectively in a non-EMIB monolithic substrate. For example, hybrid glass RDL layers with organic substrates may be manufactured and glass layers may be inserted in any layer of the substrate. Diagram 600 shows an example of two glass RDLs at two upmost layers below solder resist of a substrate that may provide low substrate thickness variation characteristics.

An organic portion 634 of the package 600 may be electrically coupled to a first glass layer 618b that includes a via 613 to electrically couple with the organic portion 634 of the package 600. The via 613 may couple with a RDL 612 in the first layer 618b, and electrically couple with a via 613 in a second glass layer 618a. The glass layers 618a, 618b are coupled with an adhesive layer 606, which may also be referred to as a dielectric adhesive. The via 613 electrically couples with an RDL layer 612 in the second glass layer 618a that is then electrically coupled to a solder 632 which is embedded in another organic layer 630. In embodiments, organic layer 630 may be a solder resist material.

Figure 7:
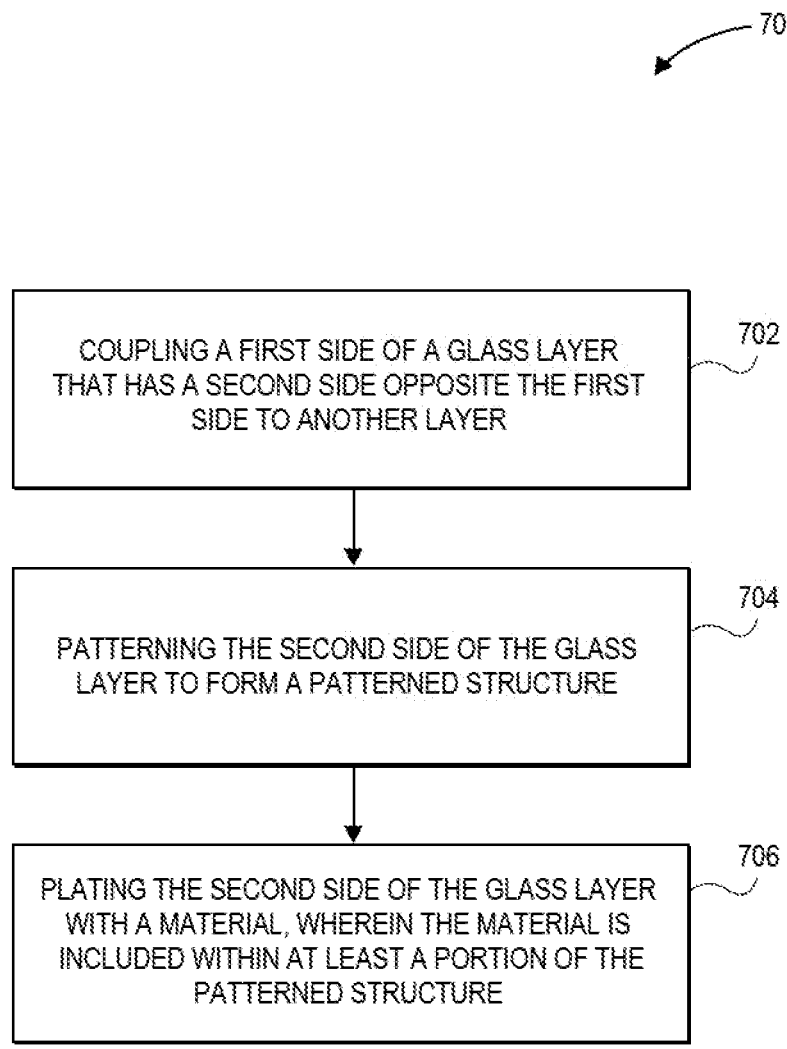
FIG. 7 illustrates an example of a process to create a glass dielectric layer with patterning within a package, in accordance with embodiments.

FIG. 7 illustrates an example of a process to create a glass dielectric layer with patterning within a package, in accordance with embodiments. Process 700 may be performed by one or more elements, techniques, or systems that may be found with respect to FIGS. 1A-6.

At block 702, the process may include coupling a first side of a glass layer that has a second side opposite the first side to another layer. The glass layer may be similar to glass layer 104 of FIGS. 1A-1E, glass layer 204 of FIG. 2, glass layer 304 of FIG. 3, glass layers 418a, 418b, 418c of FIG. 4, glass layers 518a, 518b, 518c of FIG. 5, or glass layers 618a, 618b of FIG. 6. The other layer may be similar to substrate 102 or adhesive layer 106 of FIGS. 1A-1E.

At block 704, the process may further include patterning the second side of the glass layer to form a patterned structure. The patterning process may include drilling, laser drilling, dry etching, or wet etching as described above. The pattern structure may be similar to through-holes 108 and glass surface patterning 110 of FIGS. 1B-1C.

At block 706, the process may further include plating the second side of the glass layer with a material, wherein the material is included within at least a portion of the patterned structure. The material may be a conductive material, such as copper or a copper alloy as described above. The material plated within the pattern structure may take a form that is similar to RDL 112, 120 or via 113, 121 of FIGS. 1D-1E, traces 212, pad 212a, or via 213 of FIG. 2, RDL 312, 320 or via 313, 321 of FIG. 3, via 421 of FIG. 4, RDL 524, 523 or via 521 of FIG. 5, or RDL 612 or via 613 of FIG. 6.

Figure 8:
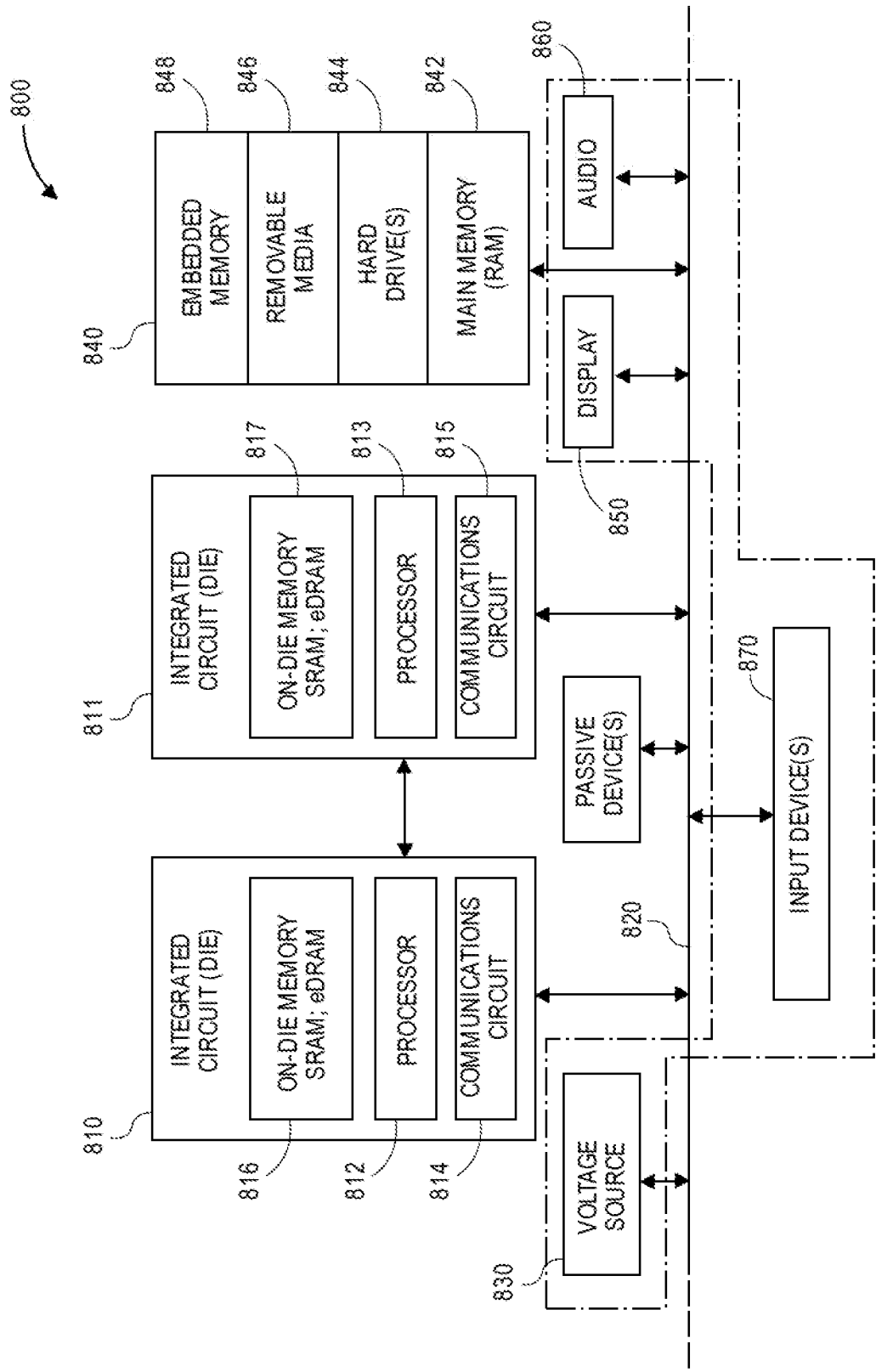
FIG. 8 schematically illustrates a computing device, in accordance with embodiments.

FIG. 8 schematically illustrates a computing device, in accordance with embodiments. The computer system 800 (also referred to as the electronic system 800) as depicted can embody a glass dielectric layer with patterning, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a glass dielectric layer with patterning, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having a glass dielectric layer with patterning, according to any of the several disclosed embodiments and their equivalents, an electronic system, a computer system, one or more methods of fabricating an integrated circuit, and one or more methods of fabricating an electronic assembly that includes a package substrate having a glass dielectric layer with patterning, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a glass dielectric layer with patterning embodiments and their equivalents. A foundation substrate may be included, as represented by the dashed line of FIG. 8. Passive devices may also be included, as is also depicted in FIG. 8.

EXAMPLES

The following paragraphs describe examples of various embodiments.

Example 1 may be a package comprising: a glass layer with a first side and a second side opposite the first side, wherein the glass layer is a dielectric layer; another layer coupled with the first side of the glass layer; and a pattern on the second side of the glass layer to receive a deposited material in at least a portion of the pattern.

Example 2 may include the package of example 1, wherein the pattern includes a trace etched in glass or a through-glass via.

Example 3 may include the package of example 2, wherein the trace etched in glass is to provide a redistribution layer (RDL).

Example 4 may include the package of example 3, wherein the RDL includes a fan out.

Example 5 may include the package of example 1, wherein the deposited material includes copper or a copper alloy, or wherein the deposited material includes a seed layer.

Example 6 may include the package of example 1 wherein the another layer is a selected one of a substrate, an adhesive layer, or another glass layer.

Example 7 may include the package of any one of examples 1-6, wherein the glass layer is a first glass layer, and the deposited material is a first deposited material; and further comprising: a second glass layer with a first side and a second side opposite the first side, wherein the first side of the second glass layer is coupled with the second side of the first glass layer; and a pattern on the second side of the glass layer to receive the second deposited material in at least a portion of the pattern.

Example 8 may include the package of example 7, wherein the another layer is a first another layer; and further comprising a second another layer between the first side of the second glass layer and the second side of the first glass layer.

Example 9 may include the package of example 7, further comprising the first deposited material and the second deposited material, wherein the first deposited material and the second deposited material are electrically conductive or are electrically coupled.

Example 10 may include the package of example 9, wherein the first deposited material and the second deposited material are different materials.

Example 11 may be a method comprising: coupling a first side of a glass layer that has a second side opposite the first side to another layer; patterning the second side of the glass layer to form a patterned structure; and plating the second side of the glass layer with a material, wherein the material is included within at least a portion of the patterned structure.

Example 12 may include the method of example 11, wherein patterning the second side of the glass layer further includes etching a trace in the second side of the glass layer or drilling a via through the glass layer.

Example 13 may include the method of example 12, wherein the etched trace is to provide a RDL or the via is to provide an electrical connection between the first side of the glass layer and the second side of the glass layer.

Example 14 may include the method of example 11, wherein the material includes copper or a copper alloy.

Example 15 may include the method of any one of examples 11-14, wherein the glass layer is a first glass layer, the deposited material is a first deposited material, and the patterned structure is a first patterned structure; and further comprising: coupling a first side of a second glass layer having the first side and a second side opposite the first side to a second side of the first glass layer; patterning the second side of the second glass layer to create a second patterned structure; and plating the second side of the second glass layer with a second deposited material, wherein the second deposited material is included within at least a portion of the second patterned structure.

Example 16 may include the method of example 15, wherein the another layer is a first dielectric layer; and wherein coupling a first side of a second glass layer having the first side and a second side opposite the first side to a second side of the first glass layer further comprises: coupling the first side of the second glass layer to a second dielectric layer; and coupling the second side of the first glass layer to the second dielectric layer.

Example 17 may include the method of example 11, further comprising, before coupling a first side of a glass layer to the dielectric layer, coupling the dielectric layer to a substrate.

Example 18 may be a system comprising: a circuit board; a package coupled with the circuit board, the package comprising: a glass layer with a first side and a second side opposite the first side; a dielectric layer coupled with the first side of the glass layer; a pattern on the second side of the glass layer; and deposited material in at least a portion of the pattern.

Example 19 may include the system of example 18, wherein the pattern includes a trace etched in glass to provide a RDL, a fan out, or a through glass via.

Example 20 may include the system of any one of examples 18-19, wherein the dielectric layer is coupled with a substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A package comprising:
    a glass layer with a first side and a second side opposite the first side, wherein the glass layer is a dielectric layer;
    another layer coupled with the first side of the glass layer; and
    a pattern on the second side of the glass layer to receive a deposited material in at least a portion of the pattern, wherein the pattern includes a trace etched in glass and a through-glass via.

2. The package of claim 1, wherein the trace etched in glass is to provide a redistribution layer (RDL).

3. The package of claim 2, wherein the RDL includes a fan out.

4. The package of claim 1, wherein the deposited material includes copper or a copper alloy, or wherein the deposited material includes a seed layer.

5. The package of claim 1 wherein the another layer is a selected one of a substrate, an adhesive layer, or another glass layer.

6. The package of claim 1, wherein the glass layer is a first glass layer, and the deposited material is a first deposited material; and
    further comprising:
        a second glass layer with a first side and a second side opposite the first side, wherein the first side of the second glass layer is coupled with the second side of the first glass layer; and
        a pattern on the second side of the second glass layer to receive the second deposited material in at least a portion of the pattern.

7. The package of claim 6, wherein the another layer is a first another layer; and
    further comprising a second another layer between the first side of the second glass layer and the second side of the first glass layer.

8. The package of claim 6, further comprising the first deposited material and the second deposited material, wherein the first deposited material and the second deposited material are electrically conductive or are electrically coupled.

9. The package of claim 8, wherein the first deposited material and the second deposited material are different materials.

* * * * *